(12) United States Patent
Erstad

(10) Patent No.: US 6,307,237 B1
(45) Date of Patent: Oct. 23, 2001

(54) L-AND U-GATE DEVICES FOR SOI/SOS APPLICATIONS

(75) Inventor: David Owen Erstad, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/473,158

(22) Filed: Dec. 28, 1999

(51) Int. Cl.[7] ............... H01L 29/76; H01L 29/94; H01L 31/062; H01L 31/113; H01L 31/119
(52) U.S. Cl. ................. 257/401; 257/353; 257/354
(58) Field of Search .................. 257/204, 205, 257/206, 210, 353, 354, 401

(56) References Cited

U.S. PATENT DOCUMENTS

| | | | |
|---|---|---|---|
| H1435 | 5/1995 | Cherne et al. | 257/347 |
| 5,298,773 | 3/1994 | Woodruff . | |
| 5,317,181 | 5/1994 | Tyson . | |
| 5,334,545 | 8/1994 | Caviglia | 437/41 |
| 5,637,899 | 6/1997 | Eimori et al. | 257/347 |
| 5,811,855 | 9/1998 | Tyson et al. . | |
| 5,821,575 | 10/1998 | Mistry et al. | 257/281 |
| 5,920,093 | 7/1999 | Huang et al. . | |
| 5,930,605 | 7/1999 | Mistry et al. | 438/149 |
| 5,939,740 | * 8/1999 | Hashimoto et al. | 257/213 |
| 5,973,362 | * 10/1999 | Park et al. | 257/344 |

FOREIGN PATENT DOCUMENTS

| | | |
|---|---|---|
| 196 23 846 A1 | 4/1997 | (DE) . |
| WO 93 08603 A | 4/1993 | (WO) . |

* cited by examiner

*Primary Examiner*—Ngân V. Ngô
(74) *Attorney, Agent, or Firm*—Kris T. Frederick

(57) ABSTRACT

A semiconductor device is disclosed that eliminates at least one of the channel/dielectric interfaces along the side walls of an SOI/SOS transistor channel, but does not require the use of a dedicated body tie contact. Because a dedicated body contact is not required, the packing density of the device may be significantly improved over conventional T-gate and H-gate configurations. The present invention may also reduce the overall gate area, which may increase both the speed and overall yield of the device.

36 Claims, 9 Drawing Sheets

PRIOR ART

PRIOR ART

L- AND U-GATE DEVICES FOR SOI/SOS APPLICATIONS

BACKGROUND OF THE INVENTION

The present invention relates to semiconductor devices, and more particularly to semiconductor devices that are formed in a thin film of semiconductor material that sits atop an insulating layer, such as Silicon-on-Insulator (SOI) or Silicon-on-Sapphire (SOS) semiconductor devices.

Thin film, co-planar integrated circuits employing silicon-on-insulator (SOI) or silicon-on-sapphire (SOS) CMOS technology typically include a semiconductor (silicon) layer, which is disposed atop a substrate-supported dielectric (silicon dioxide) layer, with the side wall perimeter of the devices bounded by an air or (oxide) dielectric layer. The air or oxide dielectric layer helps provide lateral isolation between adjacent devices.

This semiconductor structure typically includes a body/channel region disposed between and immediately contiguous with respective source and drain regions. Overlying the channel/body region and extending onto the surrounding support substrate is a doped polysilicon gate layer, which is insulated from the semiconductor material by a thin dielectric layer (e.g., gate oxide). The air or oxide dielectric layer that bounds the side wall perimeter of the device typically extends under the polysilicon gate layer and forms the side wall of the channel/body region. To reduce the resistivity of the polysilicon gate layer and the source and drain regions, a silicide layer is often provided over the polysilicon gate, and over the source and drain regions.

A disadvantage of many SOI transistors is the lack of a bulk silicon or body contact to the MOS transistor. If the channel/body region is left "floating", various hysteresis effects can prevent proper circuit operation. These effects include the so-called "kink" effect and the parasitic lateral bipolar action. The "kink" effect originates from impact ionization. For example, when an N-channel SOI/SOS MOSFET operates at a relatively large drain-to-source voltage, channel electrons with sufficient energy cause impact ionization near the drain end of the channel. The generated holes build up in the channel/body region of the device, thereby raising the body potential. The increased body potential reduces the threshold voltage of the MOSFET, which increases the MOSFET current and causes the so-called "kink" in the MOSFET current vs. voltage (I-V) curves.

If the impact ionization results in a large number of holes, the body bias may be raised sufficiently so that the source to body p-n junction is forward biased. The resulting emission of minority carriers into the channel/body region may cause a parasitic NPN bipolar transistor between the source, body and drain to turn on, leading to loss of gate control over the MOSFET current.

Both the "kink" effect and the parasitic bipolar effect can be avoided if charge is not allowed to accumulate in the channel/body region. A body contact is often used to extract the charge collected in the body/channel region. Because the hole charge in the channel/body region will move to lower potential regions, the body contact and the source terminals can be tied together to eliminate the "floating body" effects.

Another limitation of many SOI devices is that the side walls of the channel/body region, which are often bounded by an oxide dielectric layer, can be susceptible to inversion in the presence of ionizing radiation. Thus, there is a danger that a leakage path or 'parasitic' channel may be induced along the side walls of the body/channel region, and in particular, between the source and drain. This can result in significant current leakage, even when the device is tuned off. In addition, if the manufacturing process cannot accurately control the channel doping and/or the electrostatic charge build-up along the side walls of the device, significant current leakage can occur.

FIG. 1 shows a typical prior art N-channel SOI MOSFET with body control. The MOSFET is generally shown at 8, and is commonly called a T-gate MOSFET because of the T-shape of gate 14. The T-gate MOSFET 8 has an active region 10 formed on an insulating layer and surrounded by an isolation region 12. The active region 10 is divided into three regions by T-gate 14, including the source region 20, the drain region 22 and the body-tie region 24. Typically, the T-gate 14 includes a first leg 16 and a second leg 18. The N-type source/drain regions 20 and 22 are located on either side of the first leg 16 and along the lower side of the second leg 18. A P-type body tie region 24 is located above the second leg 18. Located under the first and second legs 16 and 18 is a p-type body/channel region.

The active region 10 and isolation region 12 are provided using known techniques. A thin gate oxide layer is provided over the active region 10, followed by a doped polysilicon gate layer. The doped polysilicon gate layer and the gate oxide layer are selectively etched to form the T-shaped gate 14. The source and drain regions 20 and 22 are then selectively doped with an N-type dopant (for an N-channel device). A mask, such as mask 30, is used to define the area that is to be exposed to the N-type dopant. Likewise, the body tic region 24 is selectively doped with a P-type dopant. Finally, the source region 20, the drain region 22, the body tic region 24, and the gate 14 are each covered with a silicide layer to reduce the resistance thereof.

The T-gate configuration has a number of advantageous. First, the T-gate configuration provides a body tic connection to the body/channel region under gate 14. Thus, holes that are generated in the body/channel region under the first leg 16 of gate 14, pass through the P-type region under the second leg 18, and arrive at the P-type body tieregion 24 where they are collected by the body tie contact 26. Thus, the T-gate configuration may reduce or eliminate the substrate floating effects discussed above.

Another advantage of the T-gate configuration is that the second leg 18 eliminates the channel/dielectric interface along the upper side wall 32 of the body/channel region under the first leg 16. Accordingly, the chance that a parasitic channel will be formed along the upper side wall 32 due to ionizing radiation is reduced or eliminated. The second leg 18 also functions to prevent the silicide layer from connecting the body tieregion 24 and the source region 20 and drain region 22.

A limitation of the T-gate configuration is that the channel/dielectric interface along the lower side wall 34 of the channel remains. Thus, there is still a danger that a leakage path or "parasitic" channel may be induced along the lower side wall 34 when exposed to ionizing radiation. As indicated above, this can result in significant current leakage when the device is turned off.

Another limitation of the T-gate configuration is that a separate body tie region 24 and body tie contact 26 must be provided. Most manufacturing processes have minimum spacing requirements including poly-to-contact and contact-to-field spacings. These minimum spacing requirements often result in a substantial distance between the second leg 18 and the upper edge of the active region 10, thereby reducing the packing density that can be achieved for the device. Finally, one or more metal routes must typically be provided to the body tie contact 26. These metal routes may further reduce the packing density that can be achieved by increasing congestion on the metal layer.

Another limitation of the T-gate configuration is that the lateral pitch for two adjacent transistors must typically be relatively large. To illustrate this, a second T-gate transistor is shown at 48. Because the second leg 18 must extend beyond both the left and right edges of the active region 10, each transistor must be provided in a separate active region. This alone reduces the packing density that can be achieved for the device. In addition, however, most manufacturing processes have minimum spacing requirements including poly-enclosure-of-field 40 and poly-to-poly spacing 42. These minimum spacing requirements can also significantly increase the minimum lateral pitch of two adjacent T-gate transistors.

Finally, it is recognized that the second leg 18 of the T-gate 14 increases the gate area of each transistor. The additional gate area increases the capacitance of gate 14, which reduces the speed of the device. The additional gate area also increases the thin gate oxide area, which can reduce the overall yield of the device.

FIG. 2 shows another prior art N-channel SOI MOSFET with body control. The MOSFET is generally shown at 50, and is often referred to as an H-gate MOSFET because of the H-shape of gate 51. The H-gate MOSFET 50 is similar to the T-gate MOSFET of FIG. 1, but further includes a third leg 52 along the bottom of the source and drain regions 54 and 56. An advantage of the H-gate configuration is that the third leg 52 helps eliminate the channel/dielectric interface along the lower side wall 70 of the body/channel region under the first leg 60. As such, the chance that a parasitic channel will be formed along the lower side wall 70 due to ionizing radiation is reduced. The third leg 52 also functions to prevent the suicide layer from connecting the body tie region 66 to the source region 54 and the drain region 56.

Holes generated in the body/channel region under first leg 60 may pass through the P-type region under the second leg 58, and arrive at the P-type body tie region 62 where they are collected by the body tie contact 64. The holes may also pass through the P-type region under the third leg 52, and arrive at the P-type body tie region 66, where they are collected by the body tie contacts 68. Because there are two parallel paths from the body/channel region to body tie contacts, the resistance from the body tie contacts to the body/channel region is effectively halved relative to the T-gate configuration discussed above. This allows the body/channel region to be about twice as long as the T-gate configuration of FIG. 1 while affording the same level of protection.

A limitation of the H-gate configuration is that body contacts must be provided either above the second leg 58 or below the third leg 52, or both. Since most manufacturing processes have minimum spacing requirements including poly-to-contact and contact-to-field spacings, a substantial space may be required between the second leg 58 and the upper edge of the active region or between the third leg 52 and the bottom edge of the active region, or both. Furthermore, one or more metal routes must typically be provided to the upper body contact 64 and/or the lower body contacts 68. Both of these may reduce the packing density that can be achieved.

Another limitation of the H-gate configuration is that the additional gate area of the third leg 52 increases the capacitance of the gate 51, which as described above, can reduce the speed of the device. In addition, the additional gate area of the third leg 52 increases the thin gate oxide area, which can reduce the overall yield of the device.

SUMMARY OF THE INVENTION

The present invention overcomes many of the disadvantages of the prior art by providing a semiconductor device that eliminates at least one of the channel/dielectric interfaces along the side walls of an SOI/SOS transistor channel, while not requiring the use of a dedicated body tie contact. Because a dedicated body contact is not required, the packing density of the device may be improved relative to the T-gate and H-gate configurations discussed above. The present invention may also reduce the overall gate area, which may increase both the speed and overall yield of the device.

In one illustrative embodiment of the present invention, an L-Gate device is provided. The L-gate device includes an active region formed on an insulating layer and surrounded by an isolation region. The active region has a top edge, a bottom edge, a first lateral edge, and a second lateral edge. A first leg of the L-shaped gate is spaced inward of the first lateral edge and inward of the second lateral edge, and extends into the active region over the top edge. A second leg of the L-shaped gate is spaced inward of the top edge and extends into the active region over the first lateral edge before intersecting the first leg. The second leg helps eliminate the channel/dielectric interface along one of the side walls of the body/channel region under the first leg.

A drain region is defined by the first lateral edge of the active region, the first leg, the top edge of the active region and the second leg. A source region is defined by the second lateral edge of the active region and the L-shaped gate. The source region and the drain region have a first conductivity type, while the active region under the first leg and the second leg has a second conductivity type.

To connect the channel/body region under the L-shaped gate to the source region, an implant region having the second conductivity type extends from a portion of the L-shaped gate into at least a portion of the source region. A silicide layer, preferably formed using a conventional silicide process, is then provided over at least a portion of the implant region and the source region to electrically connect the implant region to the source region. Accordingly, the source contact may be used to bias both the source and the channel/body region of the transistor. This may significantly increase the packing density of the device.

The second leg may be spaced inward from the bottom edge of the active region, thereby leaving a space between the second leg and the bottom edge of the active region. Alternatively, the second leg may overlap at least a portion of the bottom edge, which may not leave a space between the second leg and the bottom edge of the active region. Depending on the particular spacing rules used, one of these embodiments may provide an increased packing density over the other.

To help control the channel width of the device, the second leg may extend past the first leg toward the second lateral edge of the active region. The portion of the second leg that extends past the first leg may form a nub. The nub increases the channel width along the side wall that borders the second leg. By increasing the width of the channel along the side wall that borders the second leg, the amount of current that flows under the second leg will be reduced. This may help control the "effective" channel width of the device by removing the second leg as a significant conduction mechanism.

Unlike the T-gate and H-gate configurations of the prior art, two or more L-shaped gates may be provided in the same active region, so long as they share a common source. This may help increase the packing density of the device. In one example, a second L-shaped gate having a first leg and a second leg may be provided in the same active region as the first L-shaped gate discussed above. The first leg of the second L-shaped gate is preferably spaced inward of the second lateral edge and inward of the first L-shaped gate. As with the first L-shaped gate, the first leg of the second L-shaped gate preferably extends into the active region over the top edge of the active region, although it may extend into the active region over the bottom edge, if desired.

The second leg of the second L-shaped gate preferably is spaced inward from the top edge, and extends into the active region over the second lateral edge before intersecting the first leg of the second L-shaped gate. The second leg preferably does not extend to the first L-shaped gate. A second drain region is then defined by the second lateral edge of the active region, the first leg of the second L-shaped gate, the top edge of the active region, and the second leg of the second L-shaped gate. A common source region is defined by the space between the first and second L-shaped gates.

A second implant region, which may be an enlarged first implant region, preferably extends from a portion of the second L-shaped gate into at least a portion of the common source region. A silicide layer or the like may extend over at least a portion of the second implant region and over the common source region for electrically connecting the second implant region to the common source region.

Another illustrative embodiment of the present invention includes a U-Gate device. Like the L-gate device, the U-gate device is formed on an active region that is surrounded by an isolation region. The active region has a top edge, a bottom edge, a first lateral edge, and a second lateral edge. The U-gate has a first leg, a second leg and a third leg. The first leg is preferably spaced inward of the first lateral edge and inward of the second lateral edge of the active region. The second leg preferably extends into the active region over the first lateral edge and intersects the first leg, but does not extend to the second lateral edge. The third leg is preferably spaced from the second leg, and extends into the active region over the first lateral edge before intersecting the first leg. The third leg preferably does not extend to the second lateral edge. Because the second and third legs do not extend to the second lateral edge, there is a space between the first, second and third legs of the U-shaped gate and the second lateral edge.

A drain region is defined by the first lateral edge of the active region, the first leg, the second leg, and the third leg. A source region is defined between the second lateral edge and the U-shaped gate. The source region and the drain region preferably have a first conductivity type, and the active region under the first leg, second leg and third leg has a second conductivity type.

To help connect the channel/body region under the U-shaped gate to the source region, an implant region having the second conductivity type preferably extends from a portion of the U-shaped gate into at least a portion of the source region. A silicide layer or the like is then provided over at least a portion of the implant region and the source region to electrically connect the implant region to the source region.

The second leg may be spaced inward of the top edge of the active region, and the third leg may be spaced inward of the bottom edge. This leaves a space between the second leg and the top edge, and between the third leg and the bottom edge of the active region. In another illustrative embodiment, the second leg may overlap at least a portion of the top edge, and/or the third leg may overlap at least a portion of the bottom edge. This may not leave a space between the second leg and the top edge, and/or between the third leg and the bottom edge of the active region. Depending on the particular layout rules used, one of these embodiments may provide an increased packing density over the other.

It is also contemplated that the second leg and third leg may extend past the first leg toward the second lateral edge of the active region. The portion of the second leg that extends past the first leg forms a first nub, and the portion of the third leg that extends past the first leg forms a second nub. The first nub may help increase the channel width along the side wall that borders the second leg, and the second nub may help increase the channel width along the side wall that borders the third leg. Both the first nub and the second nub may thus help control the "effective" channel width of the device, as described above.

As with the L-shaped gate above, the U-shaped gate may allow multiple transistors to be placed in the same active region, so long as they share a common source. This may help increase the packing density that can be achieved. In one example, a second U-shaped gate having a first leg, a second leg and a third leg may be provided in the same active region as the first U-shaped gate discussed above. The first leg of the second U-shaped gate is preferably spaced inward of the second lateral edge and inward from the first U-shaped gate.

The second leg of the second U-shaped gate is preferably spaced inward from the top edge, and extends into the active region over the second lateral edge. The second leg of the second U-shaped gate preferably intersects the first leg of the second U-shaped gate, but does not extend to the first U-shaped gate. Likewise, the third leg of the second U-shaped gate is preferably spaced inward from the bottom edge, and extends into the active region over the second lateral edge. The third leg of the second U-shaped gate preferably intersects the first leg of the second U-shaped gate, but does not extend to the first U-shaped gate.

A second drain region is then defined by the second lateral edge of the active region, the first leg, the second leg, and the third leg of the second U-shaped gate. A common source region is defined by the space between the second U-shaped gate and the first U-shaped gate. A second implant region, which may be part of an enlarged first implant region, may extend from a portion of the second U-shaped gate and into the common source region. A silicide layer or the like may then extend over at least a portion of the second implant region and over the source region for electrically connecting the second implant region to the source region.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 3:
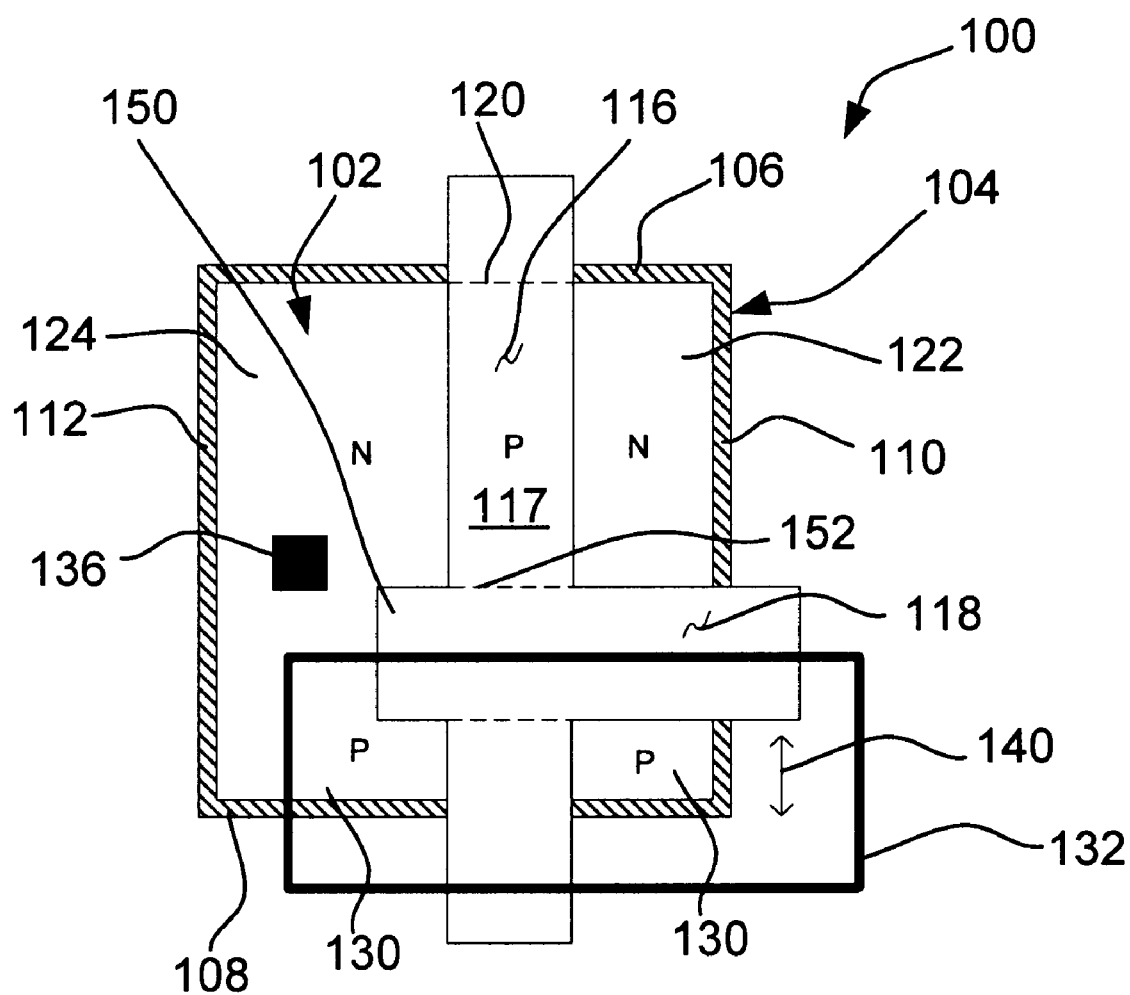
FIG. 3 is an enlarged top view of an illustrative L-gate MOSFET in accordance with the present invention.
Figure 5:
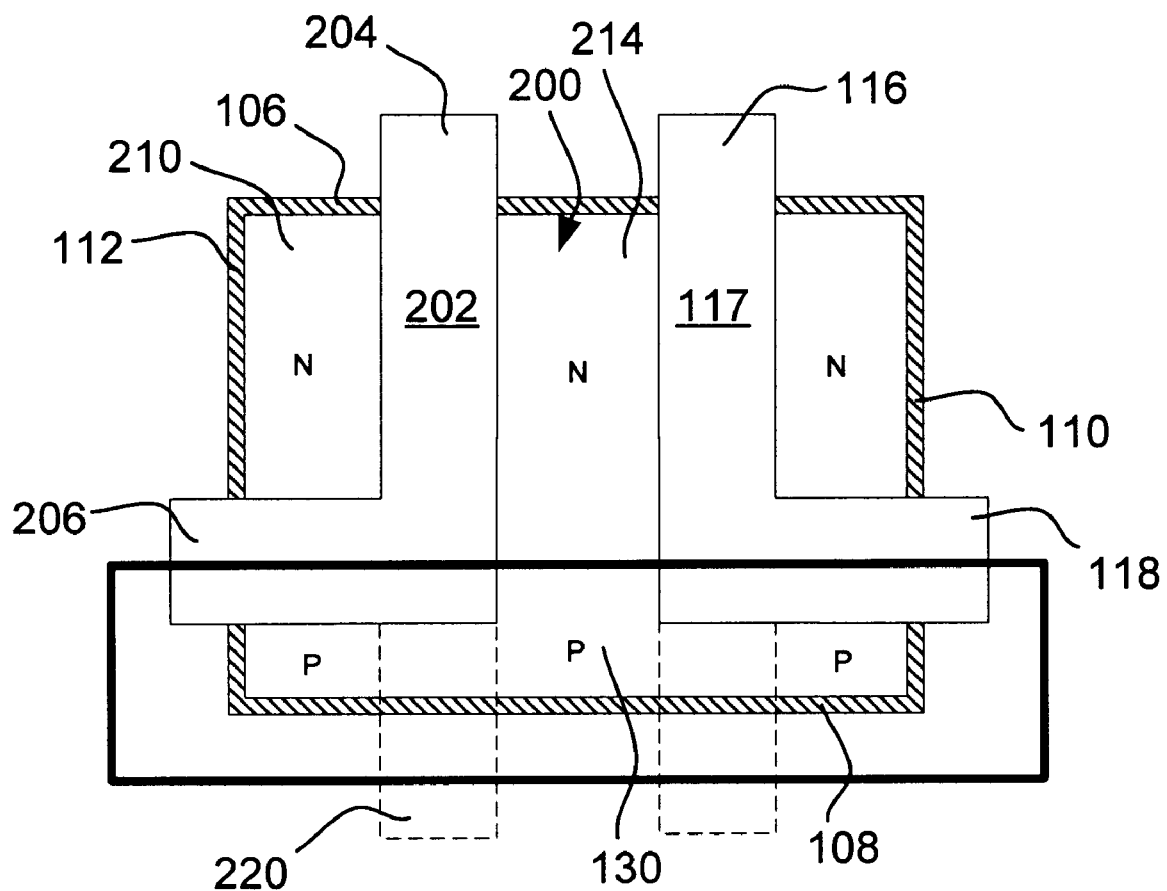
FIG. 5 is an enlarged top view of two illustrative L-gate MOSFETs in a common active region.

FIG. 3 is an enlarged top view of an illustrative L-gate MOSFET in accordance with the present invention. The L-Gate device is generally shown at 100. The L-gate device 100 includes an active region 102 formed on an insulating layer and is surrounded by an isolation region 104. The active region 102 has a top edge 106, a bottom edge 108, a first lateral edge 110, and a second lateral edge 112. A first leg 116 of the L-shaped gate 117 is spaced inward of the first lateral edge 110 and inward of the second lateral edge 112, and extends into the active region 102 over the top edge 106. A second leg 118 of the L-shaped gate 117 is spaced inward of the top edge 106 and extends into the active region 102 over the first lateral edge 110 before intersecting the first leg 116. The second leg 118 helps eliminate the channel/dielectric interface along side wall 152 of the body/channel region. The other channel/dielectric interface 120 remains. It is contemplated that the first leg 116 may extend over the bottom edge 108, or as shown in FIG. 5, stop at the second leg 118.

A drain region 122 is defined by the first lateral edge 110 of the active region 102, the first leg 116, the top edge 106 of the active region 102, and the second leg 118. A source region 124 is defined by the second lateral edge 112 of the active region 102 and the L-shaped gate 117. The source region 124 and the drain region 122 have a first conductivity type (e.g., N), while the active region 102 under the first leg 116 and the second leg 118 has a second conductivity type (e.g., P).

To help connect the channel/body region under the L-shaped gate 117 to the source region 124, an implant region 130 having the second conductivity type (e.g., P) extends from a portion of the first L-shaped gate 117 into the source region 124. The implant region 130 may be defined by mask 132.

A silicide layer, preferably formed using a conventional suicide process, is provided over at least a portion of the implant region 130 and the source region 124 to electrically connect the implant region 130 to the source region 124. Accordingly, a source contact 136 may be used to bias both the source 124 and the channel/body region of the transistor. As indicated above, this may increase the packing density of the device.

Figure 4:
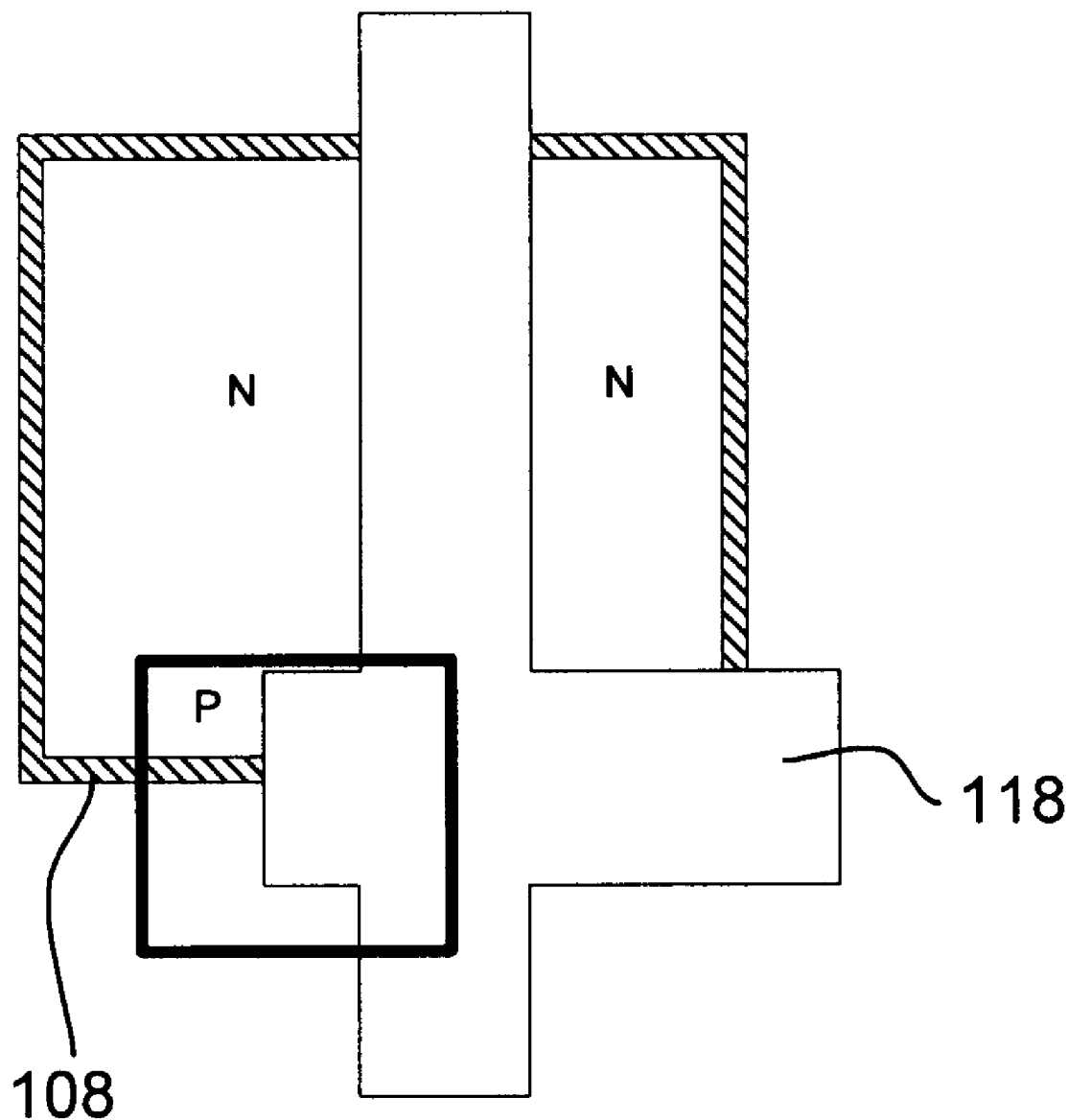
FIG. 4 is an enlarged top view of another illustrative L-gate MOSFET in accordance with the present invention.

The second leg 118 of the gate 117 may be spaced inward from the bottom edge 108 of the active region 102, as shown. This leaves a space 140 between the second leg 118 and the bottom edge 108 of the active region 102. Alternatively, and as shown in FIG. 4, the second leg 118 may overlap at least a portion of the bottom edge 108, which does not leave a space between the second leg 118 and the bottom edge of the active region 108. Depending on the particular spacing rules used, one of these embodiments may provide an increased packing density relative to the other.

It is contemplated that the second leg 118 may extend past the first leg 116 toward the second lateral edge 112 of the active region 102. The portion of the second leg 118 that extends past the first leg 116 may form a nub 150. The nub 150 increases the channel width along the side wall 152 that borders the second leg 118, which may help control the "effective" channel width of the device as described above.

Figure 1:
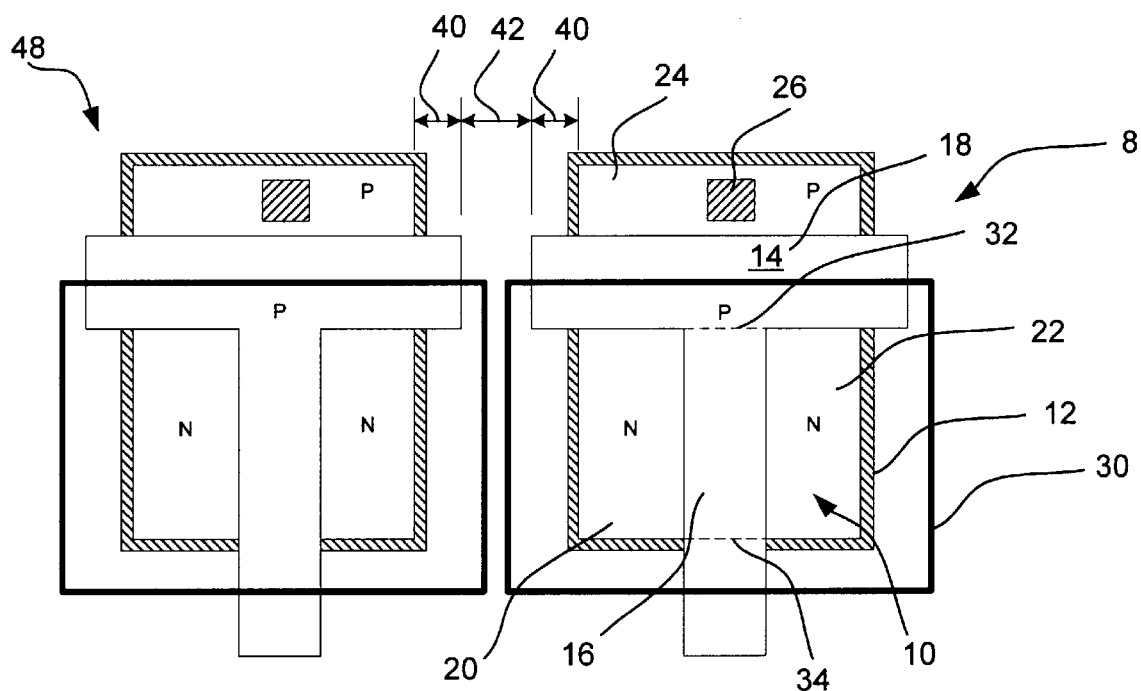
FIG. 1 is an enlarged top view of a prior art T-gate MOSFET with body control.
Figure 2:
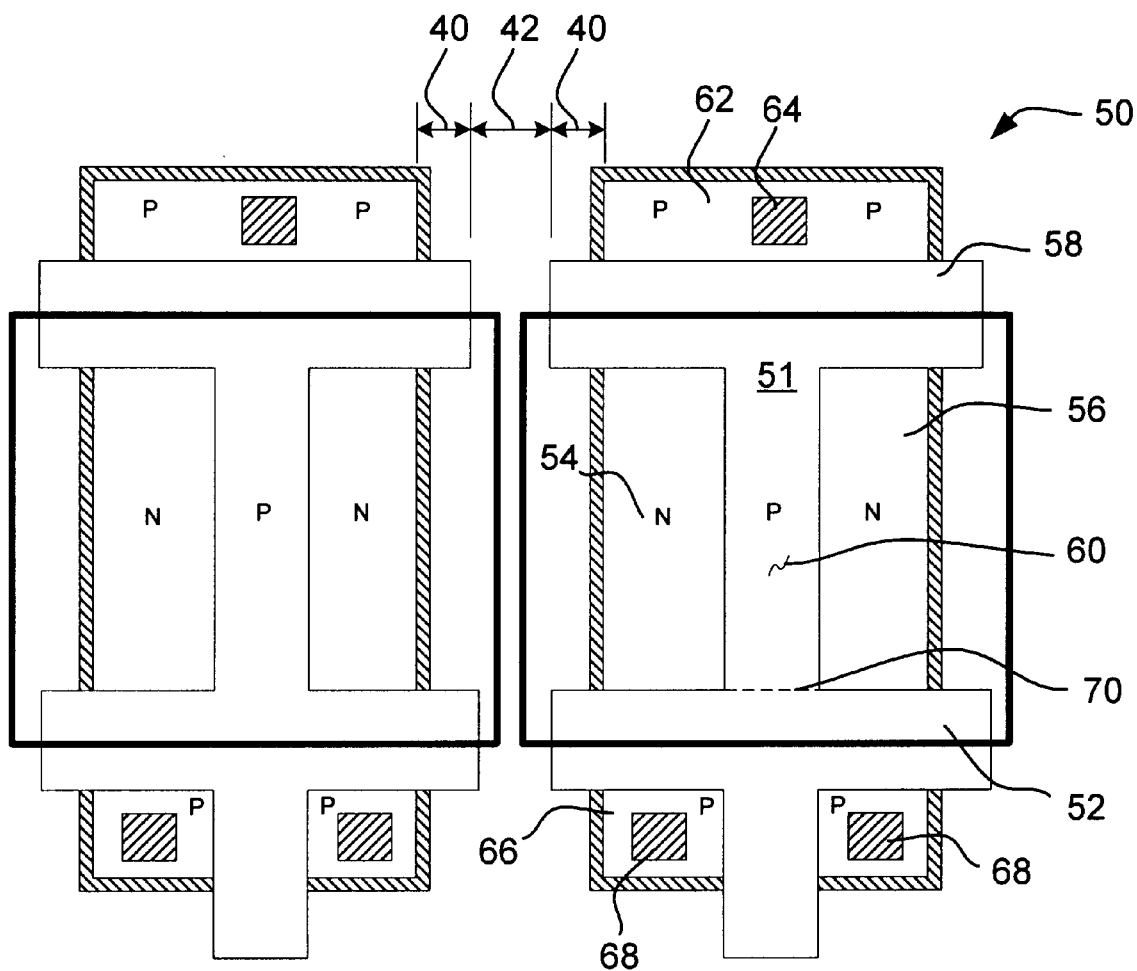
FIG. 2 is an enlarged top view of a prior art H-gate MOSFET with body control.

Because the second leg 118 does not extend to the second lateral edge 112 of the active region 102, the overall gate area may be reduced relative to the T-gate and H-gate configurations shown in FIGS. 1 and 2. This may increase the speed and overall yield of the device. In addition, since the second leg 118 does not overlap the second lateral edge 112, the spacing between two adjacent L-gate devices may be reduced relative to the prior art.

Unlike the T-gate and H-gate configurations shown in FIGS. 1 and 2, two or more L-shaped gates may be provided in the same active region, so long as they share a common source. FIG. 5 shows an enlarged top view of two L-gate MOSFETs in a common active region 200. The first L-shaped gate 117 is similar to that described above with respect to FIG. 3.

Like the first L-shaped gate 117, the second L-shaped gate 202 has a first leg 204 and a second leg 206. The first leg 204 of the second L-shaped gate 202 is spaced inward of the second lateral edge 112 and inward from the first L-shaped gate 117. The first leg 204 of the second L-shaped gate 202 preferably extends into the active region 200 over the top edge 106 of the active region 200. The first leg 204 may extend over the bottom edge 108, as shown at 220, or may stop at the second leg 206. The second leg 206 of the second L-shaped gate 202 is spaced inward from the top edge 106, and extends into the active region 200 over the second lateral edge 112 before intersecting the first leg 204. The second leg 206 preferably does not extend to the first L-shaped gate 117.

A second drain region 210 is defined by the second lateral edge 112 of the active region 200, the first leg 204 of the second L-shaped gate 202, the top edge 106 of the active region 200, and the second leg 206 of the second L-shaped gate 202. The common source region 214 is defined by the space between the first L-shaped gate 117 and the second L-shaped gate 202.

A second implant region, which in the embodiment shown is part of an enlarged first implant region 130, extends from a portion of the second L-shaped gate 202 into the common source region 214. A suilcide layer (see FIG. 8) or the like then extends over at least a portion of the second implant region 130 and over the common source region 214 for electrically connecting the second implant region 130 to the common source region 214.

It is contemplated that the second L-shaped gate 202 may be inverted relative to the first L-shaped gate 117. That is, the second leg 206 of the second L-shaped gate 202 may be positioned between the second drain region 210 and the upper edge 106 of the active region 200, if desired.

Figure 6:
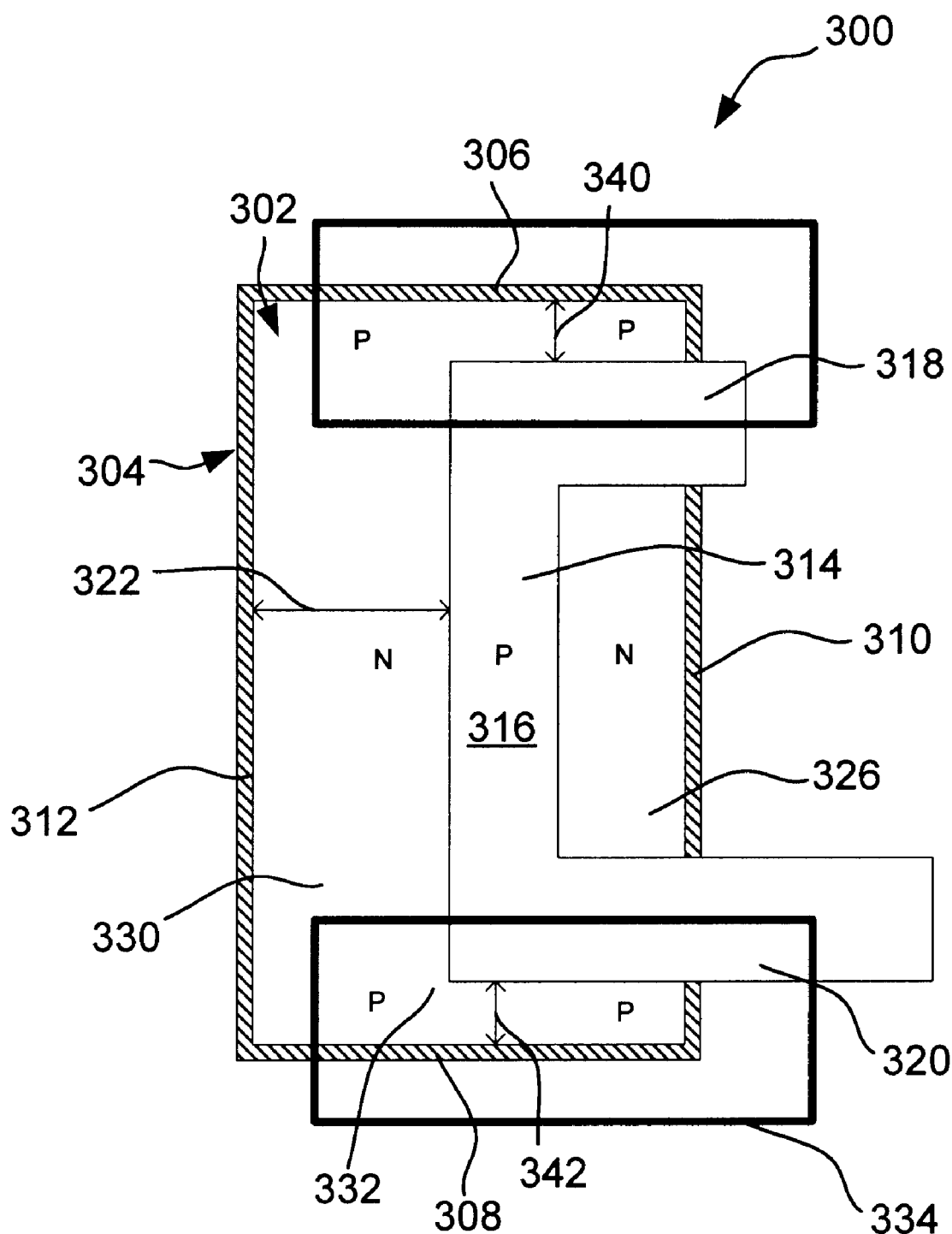
FIG. 6 is an enlarged top view of an illustrative U-gate MOSFET in accordance with the present invention.
Figure 7:
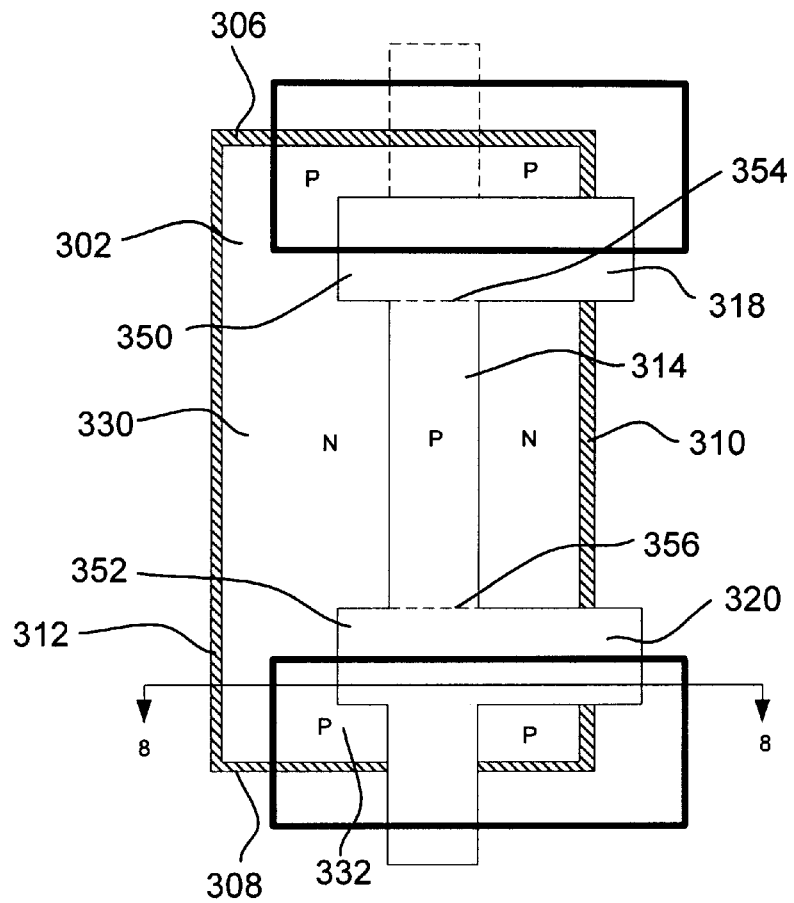
FIG. 7 is an enlarged top view of another illustrative U-gate MOSFET in accordance with the present invention.

FIG. 6 is an enlarged top view of an illustrative U-gate MOSFET in accordance with the present invention. The illustrative U-gate MOSFET is generally shown at 300. The U-gate device 300 includes an active region 302 formed on an insulating layer and is surrounded by an isolation region 304. The active region has a top edge 306, a bottom edge 308, a first lateral edge 310, and a second lateral edge 312. A first leg 314 of the U-shaped gate 316 is preferably spaced inward of the first lateral edge 310 and inward of the second lateral edge 312 of the active region 302. If desired, the first leg 314 may extend over the top edge 306 and/or over the bottom edge 308 as best shown in FIG. 7.

A second leg 318 preferably extends into the active region 302 over the first lateral edge 310 and intersects the first leg 314, but does not extend to the second lateral edge 312. A third leg 320, spaced from the second leg 318, extends into the active region 302 over the first lateral edge 310 and intersects the first leg 314, but does not extend to the second lateral edge 312. Because the second leg 318 and third leg 320 do not extend to the second lateral edge 312, there is a space 322 between the U-shaped gate 316 and the second lateral edge 312.

A drain region 326 is defined by the first lateral edge 310 of the active region 302, the first leg 314, the second leg 318, and the third leg 320. A source region 330 is defined by the second lateral edge 312 of the active region 302 and the U-shaped gate 316. The source region 330 and the drain region 326 preferably have a first conductivity type (e.g., N), and the active region 302 under the first leg 314, second leg 318 and third leg 320 have a second conductivity type (e.g., P).

To help connect the channel/body region under the U-shaped gate 316 to the source region 330, an implant region 332 having the second conductivity type (P) extends from a portion of the U-shaped gate 316 into the source region 330. A mask, such as mask 334, is preferably used to define the implant region 332. A silicide layer or the like is then provided over at least a portion of the implant region 332 and the source region 330 to electrically connect the implant region 332 to the source region 330.

Figure 9:
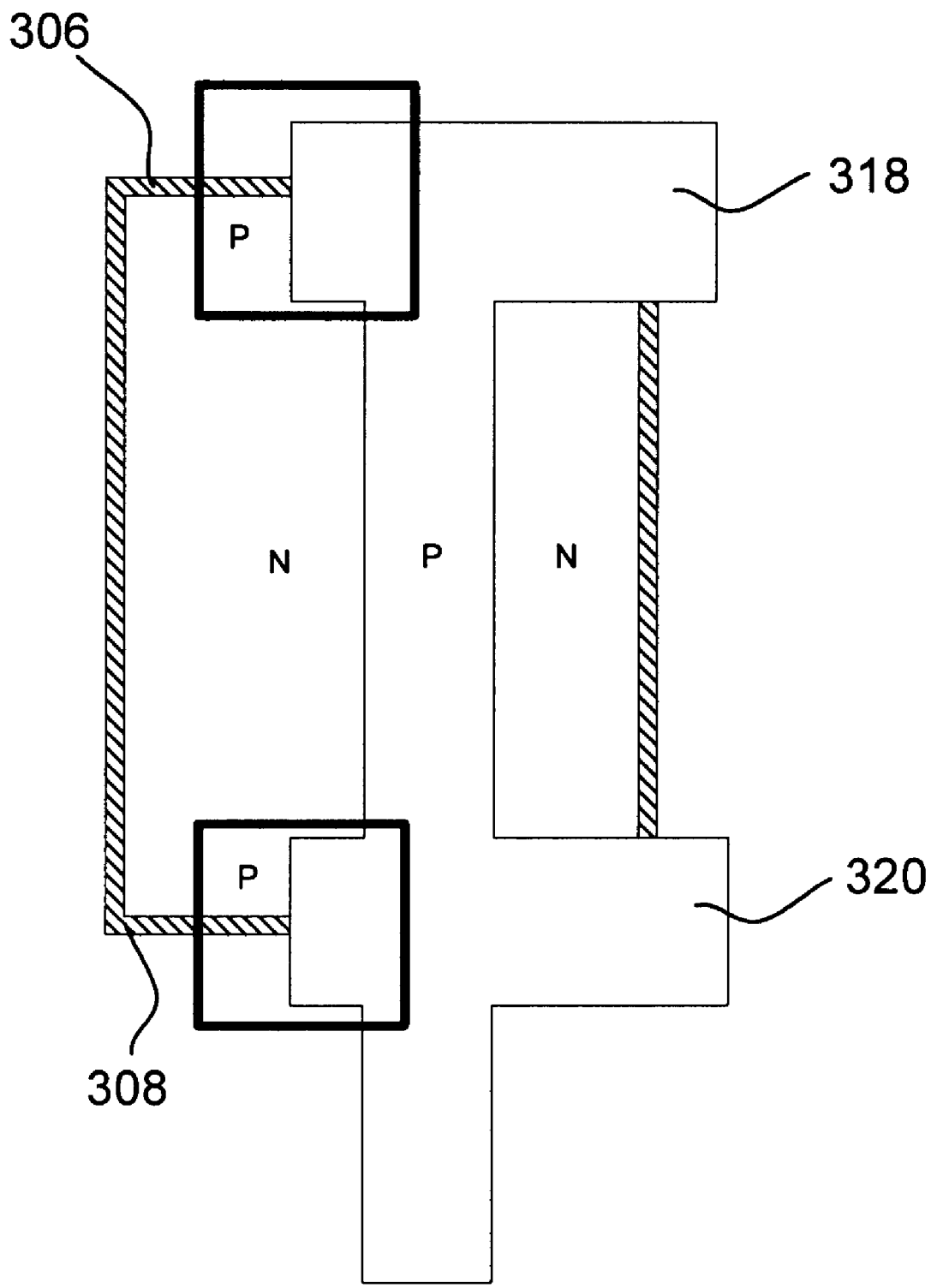
FIG. 9 is an enlarged top view of another illustrative U-gate MOSFET in accordance with the present invention.

The second leg 318 may be spaced inward of the top edge 206 of the active region 302, and the third leg 320 may be spaced inward of the bottom edge 308. This leaves a space 340 between the second leg 318 and the top edge 306, and a space 342 between the third leg 320 and the bottom edge 308 of the active region 302. Alternatively, and as shown in FIG. 9, the second leg 318 may overlap at least a portion of the top edge 306, and/or the third leg 320 may overlap at least a portion of the bottom edge 308 of the active region 302. This latter configuration does not leave any space between the second leg 318 and the top edge 306, or between the third leg 320 and the bottom edge 308 of the active region 302. Depending on the particular layout rules used, one of these embodiments may provide an increased packing density over the other.

Referring now to FIG. 7, it is contemplated that the second leg 318 and third leg 320 may extend past the first leg 314 toward the second lateral edge 312 of the active region 302. The portion of the second leg 318 that extends past the first leg forms a first nub 350, and the portion of the third leg 320 that extends past the first leg 34 forms a second nub 352. The first nub 350 may help increase the channel width along the side wall 354 that borders the second leg 318, and the second nub 352 may help increase the channel width along the side wall 356 that borders the third leg 320. As described above, both the first nub 350 and the second nub 352 may help control the "effective" channel width of the device.

Because the second leg 318 and the third leg 320 do not extend to the second lateral edge 213 of the active region 302, the overall gate area may be reduced relative to the H-gate configuration shown in FIG. 2. This may increase the speed and overall yield of the device. In addition, since the second leg 318 and the third leg 320 do not overlap the second lateral edge 312, the spacing between two adjacent U-gate devices may be reduced relative to the H-gate configuration shown in FIG. 2.

Figure 8:
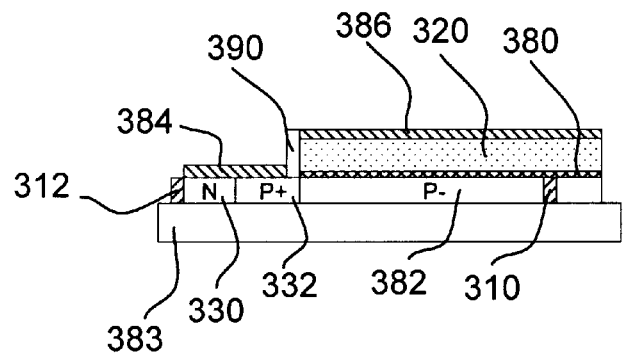
FIG. 8 is an enlarged cross-sectional view of the illustrative U-gate MOSFET of FIG. 7 taken along line 8—8.

FIG. 8 is an enlarged cross-sectional view of the U-gate MOSFET of FIG. 7 taken along line 8—8. A bottom insulating layer 383 supports the active region 302. The active region 302 includes the source region 330, the implant region 332 and the body/channel region 382. Because the implant region 332 is the same conductivity type as the body/channel region 382, the implant region 332 is electrically connected to the body/channel region 382. A silicide layer 384 is provided over the implant region 332 and the source region 330, and electrically connects the implant region 332 to the source region 330. Since the implant region 332 is electrically connected to the body/channel region 382, an electrical connection is made between the source region 330 and the body/channel region 382.

Above the body/channel region 382 is a gate oxide layer 380, which supports the second leg 320. The second leg 320 is preferably a doped polysilicon material. A spacer 390 is preferably provided between the silicide layer 384 and the second leg 320. Another silicide layer 386 is preferably provided above the second leg 320 to lower the resistance thereof.

Figure 10:
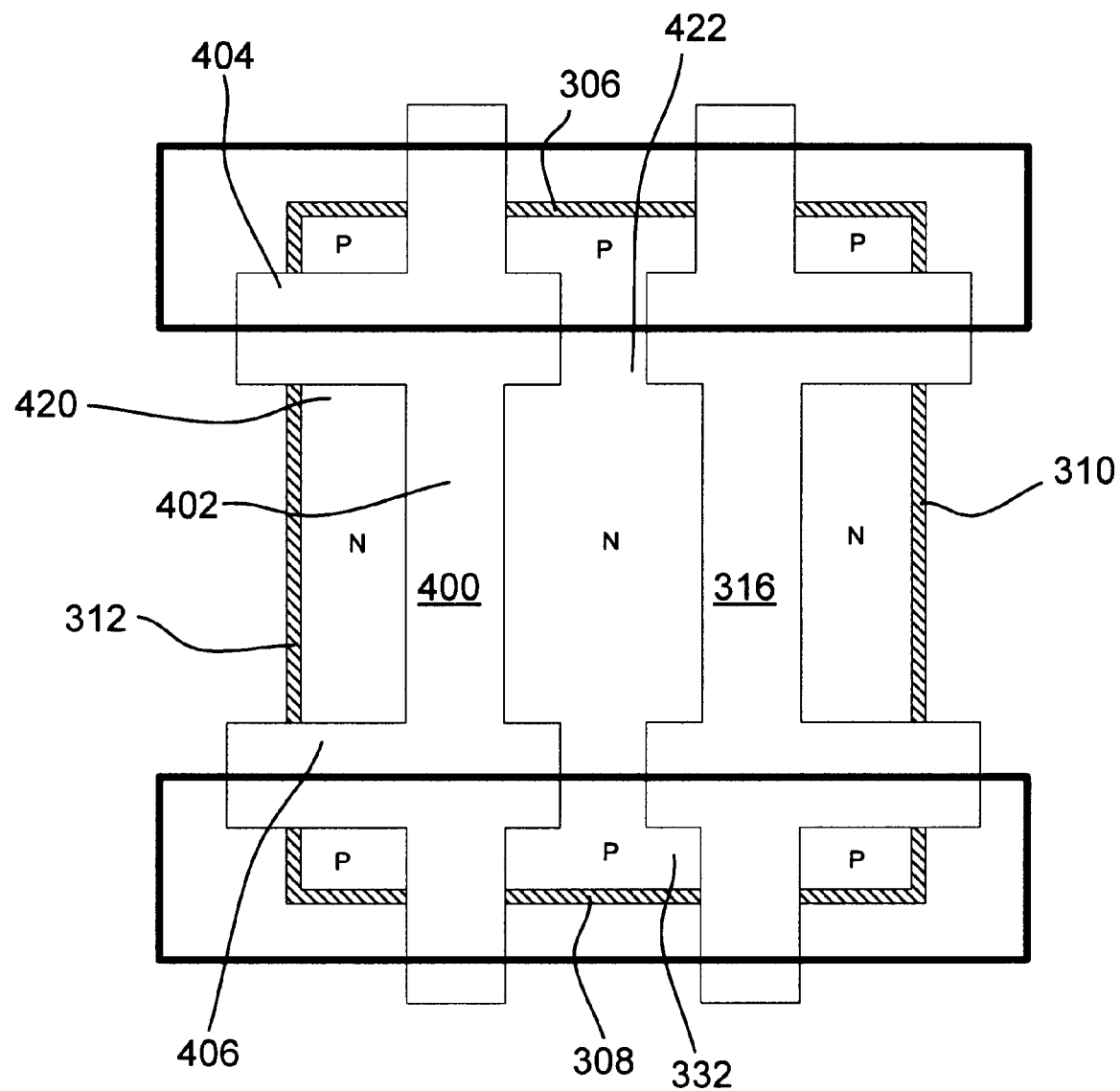
FIG. 10 is an enlarged top view of two illustrative U-gate MOSFETs in a common active region.

FIG. 10 is an enlarged top view of two illustrative U-gate MOSFETs in a common active region. As with the L-shaped gate above, the U-shaped gate may allow multiple transistors to be placed in the same active region, so long as they share a common source. This may help increase the packing density that can be achieved.

The first U-shaped gate 316 may be similar to that described above with respect to FIGS. 6–9. Like the first U-shaped gate 316, the second U-shaped gate 400 may have a first leg 402, a second leg, 404, and a third leg 406. The first leg 402 is preferably spaced inward of the second lateral edge 312 and inward from the first U-shaped gate 316. The second leg 404 is preferably spaced inward from the top edge 306, and extends into the active region over the second lateral edge 312. The second leg 404 intersects the first leg 402 of the second U-shaped gate 400, but preferably does not extend to the first U-shaped gate 316. Likewise, the third leg 406 is preferably spaced inward from the bottom edge 308, and extends into the active region over the second lateral edge 312. The third leg 406 intersects the first leg 402 of the second U-shaped gate 400, but does not extend to the first U-shaped gate 316. Alternatively, the second leg 404 and the third leg 406 may overlap at least a portion of the top and bottom edges 306 and 308, respectively.

A second drain region 420 is defined by the second lateral edge 312 of the active region, the first leg 402, the second leg 404, and the third leg 4-6 of the second U-shaped gate 400. A common source region 422 extends between the second U-shaped gate 400 and the first U-shaped gate 316. A second implant region 332, which in the embodiment shown is part of an enlarged first implant region, may extend from a portion of the second U-shaped gate 400 and into the common source region 422. A silicide layer or the like may then extend over at least a portion of the second implant region 332 and over the common source region 422 for electrically connecting the second implant region 332 to the common source region 422.

Having thus described the preferred embodiments of the present invention, those of skill in the art will readily appreciate that the teachings found herein may be applied to yet other embodiments within the scope of the claims hereto attached.

What is claimed is:

1. A semiconductor device comprising:
    active region formed on an insulating layer and surrounded by an isolation region, the active region having a top edge, a bottom edge, a first lateral edge, and a second lateral edge;
    a first L-shaped gate having a first leg and a second leg;
    the first leg of the first L-shaped gate spaced inward from the first lateral edge and spaced inward of the second lateral edge, and extending into the active region over the top edge;
    the second leg of the first L-shaped gate spaced inward of the top edge and extending into the active region over the first lateral edge, the second leg of the first L-shaped gate intersecting the first leg of the first L-shaped gate but not extending to the second lateral edge;
    a first drain region defined by the first lateral edge, the first leg of the first L-shaped gate, the top edge and the second leg of the first L-shaped gate;
    a source region defined by the second lateral edge and the first L-shaped gate;
    the source region and the drain region having a first conductivity type;
    the active region under the first leg and the second leg of the first L-shaped gate having a second conductivity type;
    a first implant region having the second conductivity type extending from a portion of the first L-shaped gate into at least a portion of the source region; and
    a first electrically conducting layer extending over at least a portion of the first implant region and the source region for electrically connecting the first implant region to the source region.

2. A semiconductor device according to claim 1, wherein the second leg of the first L-shaped gate is spaced inward of the bottom edge.

3. A semiconductor device according to claim 1, wherein the second leg of the first L-shaped gate overlaps at least a portion of the bottom edge.

4. A semiconductor device according to claim 1, wherein the first leg of the first L-shaped gate extends over the bottom edge.

5. A semiconductor device according to claim 1, wherein the second leg of the first L-shaped gate extends past the first leg of the first L-shaped gate toward the second lateral edge, thereby forming a nub.

6. A semiconductor device according to claim 1, further comprising:
    a second L-shaped gate having a first leg and a second leg;
    the first leg of the second L-shaped gate spaced inward of the second lateral edge and spaced from the first L-shaped gate, the first leg of the second L-shaped gate extending into the active region over the top edge;
    the second leg of the second L-shaped gate spaced inward from the top edge, and extending into the active region over the second lateral edge, the second leg of the second L-shaped gate intersecting the first leg of the second L-shaped gate but not extending to the first L-shaped gate;
    a second drain region defined by the second lateral edge, the first leg of the second L-shaped gate, the top edge and the second leg of the second L-shaped gate;
    the source region extending between the second L-shaped gate and the first L-shaped gate;
    the active region under the first leg and the second leg of the second L-shaped gate having the second conductivity type;
    a second implant region having the second conductivity type extending from a portion of the second L-shaped gate into at least a portion of the source region; and
    a second electrically conducting layer extending over at least a portion of the second implant region and the source region for electrically connecting the second implant region to the source region.

7. A semiconductor device according to claim 6, wherein the first implant region and the second implant region are a common implant region.

8. A semiconductor device according to claim 6, wherein the first electrically conducting layer and the second electrically conducting layer are a common electrically conducting layer.

9. A semiconductor device according to claim 8, wherein the first electrically conducting layer and the second electrically conducting layer are formed from a silicide layer.

10. A semiconductor device according to claim 6, wherein the second leg of the second L-shaped gate is spaced inward from the bottom edge.

11. A semiconductor device according to claim 6, wherein the second leg of the second L-shaped gate overlaps at least a portion of the bottom edge.

12. A semiconductor device according to claim 6, wherein the first leg of the second L-shaped gate also extends over the bottom edge.

13. A semiconductor device according to claim 6, wherein the second leg of the second L-shaped gate extends past the first leg of the second L-shaped gate toward the first lateral edge, thereby forming a nub.

14. A semiconductor device comprising:
    an active region formed on an insulating layer and surrounded by an isolation region, the active region having a top edge, a bottom edge, a first lateral edge, and a second lateral edge;
    a first U-shaped gate having a first leg, a second leg and a third leg;
    the first leg of the first U-shaped gate spaced inward from the first lateral edge and inward of the second lateral edge;
    the second leg of the first U-shaped gate extending into the active region over the first lateral edge, the second leg of the first U-shaped gate intersecting the first leg of the first U-shaped gate but not extending to the second lateral edge;
    the third leg of the first U-shaped gate spaced from the second leg of the first U-shaped gate, the third leg of the first U-shaped gate extending into the active region over the first lateral edge and intersecting the first leg of the first U-shaped gate but not extending to the second lateral edge;
    a first drain region defined by the first lateral edge, the first leg of the first U-shaped gate, the second leg of the first U-shaped gate and the third leg of the first U-shaped gate;
    a source region defined by the second lateral edge and the first U-shaped gate;
    the source region and the drain region having a first conductivity type;
    the active region under the first leg, the second leg and the third leg of the first U-shaped gate having a second conductivity type;

a first implant region having the second conductivity type extending from a portion of the first U-shaped gate into at least a portion of the source region; and a first electrically conducting layer extending over at least a portion of the first implant region and the source region for electrically connecting the first implant region to the source region.

15. A semiconductor device according to claim 14, wherein the second leg of the first U-shaped gate is spaced inward of the top edge.

16. A semiconductor device according to claim 14, wherein the second leg of the first U-shaped gate overlaps at least a portion of the top edge.

17. A semiconductor device according to claim 14, wherein the third leg of the first U-shaped gate is spaced inward of the bottom edge.

18. A semiconductor device according to claim 14, wherein the third leg of the first U-shaped gate overlaps at least a portion of the bottom edge.

19. A semiconductor device according to claim 14, wherein the first leg of the first U-shaped gate extends over the bottom edge.

20. A semiconductor device according to claim 14, wherein the first leg of the first U-shaped gate extends over the top edge.

21. A semiconductor device according to claim 14, wherein the second leg of the first U-shaped gate extends past the first leg of the first U-shaped gate toward the second lateral edge, thereby forming a first nub.

22. A semiconductor device according to claim 14, wherein the third leg of the first U-shaped gate extends past the first leg of the first U-shaped gate toward the second lateral edge, thereby forming a second nub.

23. A semiconductor device according to claim 14, further comprising:

a second U-shaped gate having a first leg, a second leg and a third leg;

the first leg of the second U-shaped gate spaced inward of the second lateral edge and spaced from the first U-shaped gate;

the second leg of the second U-shaped gate extending into the active region over the second lateral edge, the second leg of the second U-shaped gate intersecting the first leg of the second U-shaped gate but not extending to the first U-shaped gate;

the third leg of the second U-shaped gate spaced from the second leg of the second U-shaped gate and extending into the active region over the second lateral edge, the third leg of the second U-shaped gate intersecting the first leg of the second U-shaped gate but not extending to the first U-shaped gate;

a second drain region defined by the first second edge, the first leg of the second U-shaped gate, the second leg of the second U-shaped gate and the third leg of the second U-shaped gate;

the source region defined by the space between the first U-shaped gate and the second U-shaped gate;

the active region under the first leg, the second leg and the third leg of the second U-shaped gate having the second conductivity type;

a second implant region extending from a portion of the second U-shaped gate into at least a portion of the source region; and a second electrically conducting layer extending over at least a portion of the second implant region and the source region for electrically connecting the second implant region to the source region.

24. A semiconductor device according to claim 23, wherein the first implant region and the second implant region are a common implant region.

25. A semiconductor device according to claim 24, wherein the first electrically conducting layer and the second electrically conducting layer are a common electrically conducting layer.

26. A semiconductor device according to claim 25, wherein the first electrically conducting layer and the second electrically conducting layer are formed from a silicide layer.

27. A semiconductor device according to claim 23, wherein the second leg of the second U-shaped gate is spaced inward of the top edge.

28. A semiconductor device according to claim 23, wherein the second leg of the second U-shaped gate overlaps at least a portion of the top edge.

29. A semiconductor device according to claim 23, wherein the third leg of the second U-shaped gate is spaced inward of the bottom edge.

30. A semiconductor device according to claim 23, wherein the third leg of the second U-shaped gate overlaps at least a portion of the bottom edge.

31. A semiconductor device according to claim 23, wherein the first leg of the second U-shaped gate extends over the bottom edge.

32. A semiconductor device according to claim 23, wherein the first leg of the second U-shaped gate extends over the top edge.

33. A semiconductor device according to claim 23, wherein the second leg of the second U-shaped gate extends past the first leg of the second U-shaped gate toward the first lateral edge, thereby forming a third nub.

34. A semiconductor device according to claim 33, wherein the third leg of the second U-shaped gate extends past the first leg of the second U-shaped gate toward the first lateral edge, thereby forming a fourth nub.

35. A semiconductor device according to claim 23, wherein the first, second and third legs of the first U-shaped gate are integrally formed.

36. A semiconductor device according to claim 35, wherein the first, second and third legs of the second U-shaped gate arc integrally formed.

* * * * *